United States Patent [19]

Schneider et al.

[11] 4,362,904

[45] Dec. 7, 1982

[54] PRINTED CIRCUIT BOARD COMPONENT MOUNTING SUPPORT AND SPACER

[75] Inventors: Richard E. Schneider, Amherst; Stephen L. Majesky, Wellington, both of Ohio

[73] Assignee: Reliance Electric Company, Cleveland, Ohio

[21] Appl. No.: 340,480

[22] Filed: Jan. 18, 1982

[51] Int. Cl.³ .............................................. H05K 7/00
[52] U.S. Cl. .................................. 174/138 G; 361/403
[58] Field of Search ................... 174/138 G; 361/403, 361/418

[56] References Cited

U.S. PATENT DOCUMENTS 3,714,514  1/1973  Vesterling ................. 174/138 G X
4,254,301  3/1981  Serino .............................. 174/138 G Primary Examiner—Laramie E. Askin
Attorney, Agent, or Firm—Michael M. Rickin; Roy F. Hollander

[57] ABSTRACT

A printed circuit board component mounting support and spacer having a base with an essentially rectangular face and at least four essentially rectangular feet extending out from the rectangular planar surface of the base. Extending upwards from the base from the long edges thereof are two essentially rectangular sides to cradle an electrical component. The base has two slots extending inward from the short edges thereof a predetermined distance. The slots terminate in an edge of a predetermined configuration and are wide enough to permit the passage of component electrical leads therebetween.

8 Claims, 5 Drawing Figures

U.S. Patent  Dec. 7, 1982  4,362,904
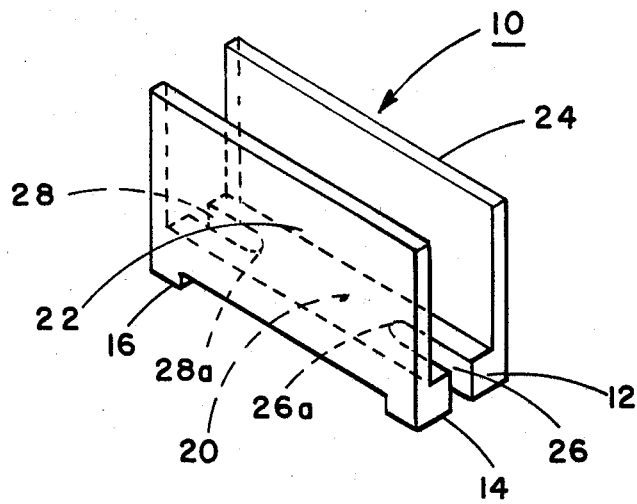
FIG. 1
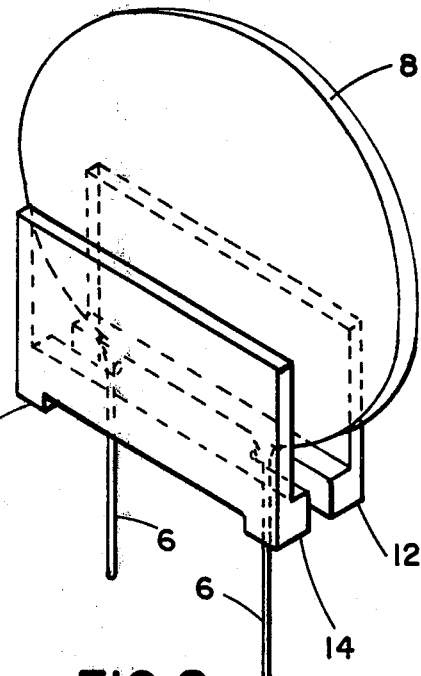
FIG. 2
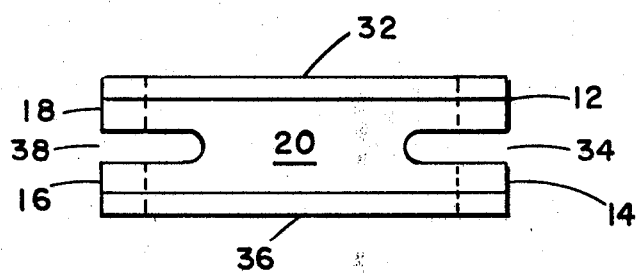
FIG. 3A
FIG. 3B
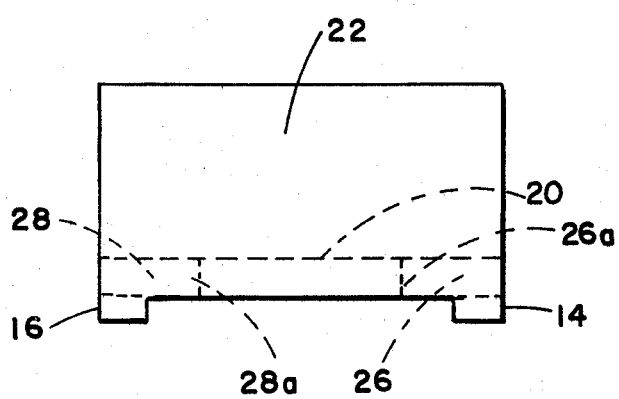
FIG. 3C
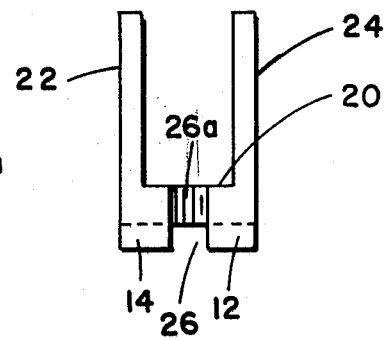

PRINTED CIRCUIT BOARD COMPONENT MOUNTING SUPPORT AND SPACER

BACKGROUND OF THE INVENTION

1. Field of the Invention

The present invention relates to a device for supporting electrical components and more particularly for supporting those electrical components which are mounted on printed circuit boards and have generally circular shaped portions such as disc capacitors.

2. Description of the Prior Art

For certain components having regular shapes, circuit board mounting has not presented any substantial problems. These components are provided with surfaces which abut the mounting surfaces of the board in the mounted condition. They are, therefore, stable against vibrations or other undesired movements. In effect, these components are provided with an inherently flat base which abuts against the mounting surface and renders the component immune to a great extent to undesired movements once the components has been mounted.

Many components, however, are not shaped in such a way that they have a flat base portion which mates with the mounting surface of the board in the region of the leads of the electrical component. For example, many capacitors and particularly disc capacitors have rounded portions in the region of the lead. Depending on the size of the disc capacitor, these portions may either rest on the surface of the circuit board after mounting or be above the surface of the board. In the latter case, support for the component is provided by the leads. Therefore, such larger size disc capacitors are not in stable positions with respect to the circuit board in that they usually can and do move in response to movement of the board or to vibrations thereof. Since support of these larger size disc capacitors is provided by the component leads passing through the holes in the board, this creates the danger that movement of the components; and the corresponding flexing of the leads may result in the weakening and ultimate breakage of the leads. Thus, it is necessary to provide support for larger size disc capacitors when they are mounted on circuit boards in order that such lead breakage be minimized.

One technique used in the prior art for providing support for such larger size disc capacitors is to use an adhesive and sealant such as Dow Corning type 734 RTV. The capacitors are then glued either to each other or to other components or even the circuit board itself, depending on the arrangement of the components on the board. While such a technique provides the needed support for the larger size disc capacitors, it has many drawbacks. Among these are the increased production time associated with those circuit boards having disc capacitors. The typical adhesive and sealant used for these purposes generally requires a long curing period such that the board cannot be further processed until the adhesive cures. Quite typically the adhesive is placed on the components late in the afternoon in order to allow the curing to occur overnight. Additionally, once the larger size disc capacitors are glued in place by the adhesive, it becomes quite difficult to change the capacitor if the component should ever fail. Also, as the capacitor may be glued to another component, the failure of the capacitor would more than likely not only require the capacitor to be changed, but the other component as well. Finally, the use of an adhesive to provide support gives an unaesthetic appearance to the circuit board as it is hard to control the amount of adhesive which is applied to each component.

Component supports are known. One such example of a prior art component support is described in U.S. Pat. No. 3,714,514 which issued on Jan. 30, 1973. The structure described therein is used to provide support for those capacitors which have spherical or tear-shaped portions such as tantalum electrolytic capacitors. The socket has a nesting portion which is adapted to receive the spherical or tear-shaped capacitor portions in abutting relationship with the capacitor being supported by the socket only at the rounded bottom of the capacitor. The socket also has a base portion having a surface corresponding to and abutting against the mounting surface of the circuit board in the mounted position of the socket. The socket also includes a short projection which fits into a corresponding socket locating hole in the circuit board.

Another such example of a component support is described in U.S. Pat. No. 4,254,301 which issued on Mar. 3, 1981. The support described therein is not itself mounted to the board. Extending from the base which has an essentially square face are four projecting fingers to cradle the component. The base has a cutout hole through which the component leads are inserted before they are put through the holes in the board. Between opposite pairs of the projecting fingers are upwardly projecting nibs or projections for contacting the bottom of the component.

For a disc capacitor, on the other hand, it is desirable to provide a component support whose sides are rectangular in shape and extend upward from the generally rectangular shaped base of the mounting socket to provide the needed lateral support and thereby prevent unnecessary motion of the capacitor. It is also desirable that the socket be manufactured from nonconductive material which is sufficiently flexible to thereby allow the sides to move when the disc capacitor is inserted into the socket. It is further desirable that such a component support include means so that its base does not abut the surface of the board when the support is mounted thereon to thereby allow both wave soldering of the component leads and flushing action for cleaning after the soldering.

SUMMARY OF THE INVENTION

In accordance with the present invention there is disclosed a component mounting support and spacer which has a base of generally rectangular configuration. Extending downwards from the base are four essentially rectangular feet. Two essentially rectangular sides extend upwards from the base, from the long edges thereof. There are two slots in the base extending inwards from the short edges a predetermined distance. The edges of the slots are essentially parallel to the long edges of the base. Each of the slots terminates in an edge of predetermined configuration, and the spacing between the slot edges is wide enough to allow component leads to be passed therebetween.

DESCRIPTION OF THE DRAWINGS

For a more complete understanding of the invention, reference may be had to the following detailed description of the invention in conjunction with the drawings wherein:

FIG. 1 is a perspective view of the support/spacer in accordance with the invention;

FIG. 2 is a perspective view of the support/spacer in accordance with the invention as set forth in FIG. 1 but with a circuit component shown in operating relationship with the support/spacer; and FIGS. 3A, 3B, and 3C are front, side and end views respectively, of the support/spacer in accordance with the present invention.

DETAILED DESCRIPTION OF THE INVENTION

The figures show a support/spacer for positioning components on a printed circuit board. The figures include similar reference numbers when appropriate and will be discussed in reference to the invention all at once.

The support/spacer 10, as shown in the Figures, presents essentially a rectangular face 32, 34, 36, 38 having two long edges 32, 36 and two short edges 34, 38 to the printed circuit board (not shown). This rectangular face does not contact the board as there are at least four rectangular feet 12, 14, 16, 18 extending out from the rectangular planar surface of base 20. These feet end in a planar surface parallel to the surface from which the feet begin. This second planar surface allows support/spacer 10 to sit flat and stable on the board itself. The feet are shown to be vertically extended from base 20, but they could just as well have been inclined inwards towards the rectangular face.

Extending upwards from the long edges of base 20 are essentially parallel and rectangular sides 22 and 24. It is these sides which would cradle the electrical component to be supported. In the figures shown, the height of the sides is about ten times the length of the downward extended feet.

In the solid rectangular base 20 of the spacer are slots 26 and 28 which extend inwardly from approximately the center of the short edges of the base. The slots are parallel to sides 22 and 24 and each extends inwardly for a predetermined distance which is approximately one-third of the distance from the associated edge to the center of the base. Each slot is terminated in a semicircular portion 26a and 28a, respectively, whose radius is sufficient to accommodate component leads of varying thicknesses. Of course, the slots could be terminated in a nonsemicircular portion provided that the spacing between slots was sufficiently wide to accommodate the component leads mentioned above.

The process would be as follows. The operator would take the electrical component 8 is one hand, pick up a support/spacer 10 of the present invention in the other hand and place the component between the sides 22 and 24 with the leads 6 extending through slots 26 and 28. The portion of the component from which the leads enamate would be placed in close proximity to base 20. With the component now in the support, the leads of the component would be inserted in the appropriate holes in the board in a manner to insure that all four feet of the support are in contact with the board. Then the leads can be clipped and soldered to the board in the well-known prior art manners. Of course, the above process can be automated for assembly line production.

If the parts to be protected are disc capacitors which range in size from ½ inch (12.1 mm) to 1¼ inches (31.75 mm) in diameter and 1/16 inch (1.588 mm) to 3/16 inches (4.76 mm) in thickness, for example, the overall height of support/spacer 10 would be 0.375 inches (9.525 mm). Each foot would be 0.080 inches (2.03 mm) square and would extend downward about 0.031 inches (0.787 mm). Sides 22 and 24 would be approximately 0.0375 inches (0.95 mm) thick and 0.625 inches (15.87 mm) wide which is also the length of the long edge of the base. The length of the short edge of the base is approximately 0.200 inches (5.08 mm). Each slot 26 and 28 would be 0.125 inches (3.18 mm) long and end in a semicircle having a radius of 0.020 inches (0.508 m). Of course, the above dimensions would change depending upon the thickness and/or diameter of the disc capacitor that is desired to be protected by support/spacer 10. It should, however, be appreciated that a single support/spacer 10 can provide protection for disc capacitors of differing diameters and thicknesses because of the flexibility of sides 22 and 24. Support/spacer 10 may be constructed from any one of a number of known nonconductive flexible materials. Of course, for components different in size from those described above, the dimensions would change accordingly without departing from the spirit and scope of the invention.

While the invention has been described with reference to specific embodiments, it will be understood by those skilled in the art that various changes may be made and equivalents may be substituted for elements thereof without departing from the true spirit and scope of the invention. In addition, many modifications may be made without departing from the essential teachings of the invention.

What is claimed is:

1. A printed circuit board component mounting support and spacer comprising:
   (a) a base with an essentially rectangular configuration having two long edges and two short edges;
   (b) at least four essentially rectangular feet extending downwards from said base;
   (c) two essentially rectangular sides each extending in a direction substantially upwards from the base, each of said sides being associated with a respective one of said long edges; and
   (d) two slots in said base each having edges essentially parallel to said base long edges, each of said slots extending inwards from a respective one of said base short edges a predetermined distance, each of said slots terminating in an edge of predetermined configuration, said slots being wide enough to permit passage of the electrical leads of a component therebetween.

2. A component mounting support and spacer as set forth in claim 1 wherein said essentially rectangular sides are about ten times the length of said feet.

3. A component mounting support and spacer as set forth in claim 1 or 2 wherein said slots extend inward toward the center of said base about one-third of the distance said associated base short edge is from said center.

4. A component mounting support and spacer as set forth in claim 3 wherein the plane of the feet, the plane of the base and the plane of the sides are parallel to each other.

5. A component mounting support and spacer as set forth in claim 1 wherein said predetermined configuration is a semicircle of predetermined radius.

6. A component mounting support and spacer as set forth in claim 5 wherein said predetermined radius is approximately one-tenth of the length of said short side.

7. A component mounting support and spacer as set forth in claim 1 or 5 wherein said slots extend inward from the center of said base short edge.

8. A component mounting support and spacer as set forth in claim 1 wherein said sides extend substantially normally upwards from said base.

* * * * *